(12) United States Patent
Tung et al.

(10) Patent No.: US 9,378,973 B1
(45) Date of Patent: Jun. 28, 2016

(54) METHOD OF USING SIDEWALL IMAGE TRANSFER PROCESS TO FORM FIN-SHAPED STRUCTURES

(71) Applicant: UNITED MICROELECTRONICS CORP., Hsin-Chu (TW)

(72) Inventors: Yu-Cheng Tung, Kaohsiung (TW); En-Chiuan Liou, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/842,845

(22) Filed: Sep. 2, 2015

(30) Foreign Application Priority Data

Jul. 1, 2015 (TW) .............................. 104121304 A

(51) Int. Cl.
*H01L 21/308* (2006.01)
*H01L 21/3065* (2006.01)
*H01L 29/66* (2006.01)
*H01L 21/8234* (2006.01)

(52) U.S. Cl.
CPC ........ *H01L 21/3088* (2013.01); *H01L 21/3065* (2013.01); *H01L 21/3081* (2013.01); *H01L 21/3085* (2013.01); *H01L 21/3086* (2013.01); *H01L 21/823431* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,955,961 B1 * | 10/2005 | Chung | H01L 21/0337 257/E21.038 |
| 7,611,980 B2 * | 11/2009 | Wells | H01L 21/0337 257/435 |
| 7,666,578 B2 | 2/2010 | Fischer et al. | |
| 7,960,287 B2 * | 6/2011 | Johnson | H01L 21/823431 438/197 |
| 7,989,355 B2 * | 8/2011 | Shieh | H01L 21/3086 257/E21.035 |
| 8,227,349 B2 | 7/2012 | Kim et al. | |
| 8,247,291 B2 | 8/2012 | Min et al. | |
| 8,293,656 B2 | 10/2012 | Kim et al. | |
| 8,900,937 B2 * | 12/2014 | Lin | H01L 21/823431 438/157 |
| 8,921,034 B2 * | 12/2014 | Hopkins | H01L 27/10894 257/499 |
| 9,035,416 B2 * | 5/2015 | Fischer | H01L 21/0338 257/499 |
| 9,040,371 B2 | 5/2015 | Cheng et al. | |
| 9,087,792 B2 * | 7/2015 | Cheng | H01L 27/0886 |
| 9,177,797 B2 * | 11/2015 | Chang | H01L 21/0338 |
| 2007/0161251 A1 * | 7/2007 | Tran | H01L 21/0337 438/725 |
| 2007/0170521 A1 * | 7/2007 | Abadeer | H01L 21/845 257/401 |
| 2010/0136790 A1 * | 6/2010 | Chang | H01L 21/0337 438/694 |
| 2013/0309838 A1 * | 11/2013 | Wei | H01L 21/76229 438/424 |
| 2014/0099792 A1 * | 4/2014 | Bergendahl | H01L 21/3086 438/696 |
| 2015/0076663 A1 | 3/2015 | Hopkins | |

* cited by examiner

*Primary Examiner* — Andres Munoz

(74) *Attorney, Agent, or Firm* — Winston Hsu; Scott Margo

(57) ABSTRACT

A method for fabricating semiconductor device is disclosed. The method includes the steps of: providing a substrate having a first region and a second region; forming a plurality of mandrels on the first region and a plurality of patterns on the second region, in which the widths of the patterns on the second region are greater than the widths of the mandrels on the first region; forming a hard mask on the second region to cover the patterns; and forming a cap layer on the first region and the second region to cover the mandrels and the hard mask.

11 Claims, 13 Drawing Sheets

METHOD OF USING SIDEWALL IMAGE TRANSFER PROCESS TO FORM FIN-SHAPED STRUCTURES

BACKGROUND OF THE INVENTION

1. Field of the Invention

The invention relates to a method for fabricating semiconductor device, and more particularly, to a method of using sidewall image transfer (SIT) process to form fin-shaped structures.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

A method for fabricating semiconductor device is disclosed. The method includes the steps of: providing a substrate having a first region and a second region; forming a plurality of mandrels on the first region and a plurality of patterns on the second region, in which the widths of the patterns on the second region are greater than the widths of the mandrels on the first region; forming a hard mask on the second region to cover the patterns; and forming a cap layer on the first region and the second region to cover the mandrels and the hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
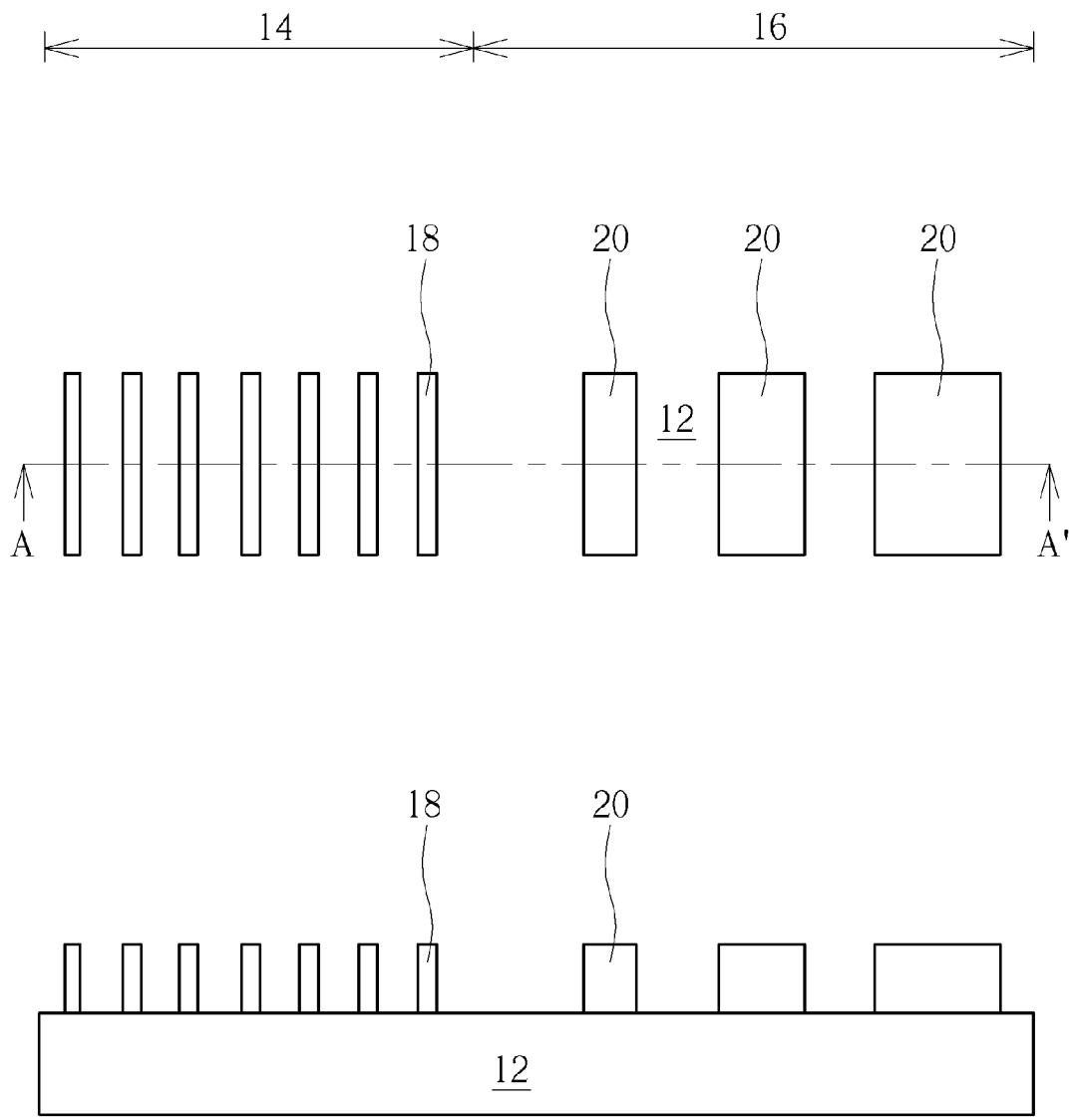
FIGS. 1-9 illustrate a method for fabricating semiconductor device according to a preferred embodiment of the present invention.

Referring to FIGS. 1-9, FIGS. 1-9 illustrate a method for fabricating semiconductor device according to a preferred embodiment of the present invention, in which the top portion of each figure illustrates top-views for fabricating a semiconductor device of the present invention while the bottom portion of each figure illustrates cross-sectional views of the top portion along sectional line AA'. As shown in FIG. 1, a substrate 12, such as a silicon substrate is first provided, and a first region 14 and a second region 16 are defined on the substrate 12. In this embodiment, the first region 14 is preferably used for fabricating FinFET devices in the later process while the second region 16 is used for fabricating active devices such as planar MOS transistors or other passive devices.

Next, a plurality of mandrels 18 is formed on the first region 14 and a plurality of patterns 20 are formed on the second region 16. In this embodiment, the formation of the mandrels 18 and patterns 20 could be accomplished by first forming a material layer (not shown) on the substrate 12, and a pattern transfer process, such as an etching process could be conducted to remove part of the material layer for forming patterned material layers or mandrels 18 on the first region 14 and patterns 20 on the second region 16. In this embodiment, the mandrels 18 and the patterns 20 could be selected from the group consisting of amorphous silicon, polysilicon, silicon oxide, and silicon nitride, but not limited thereto.

It should be also noted that since the mandrels 18 and patterns 20 are formed from the same photo-etching process, the mandrels 18 and the patterns 20 preferably share same thickness. In addition, the width of each mandrel 18 and widths or pitches between adjacent mandrels 18 on the first region 14 are preferably the same while the width of each pattern 20 on the second region 16 could be the same or different, and widths or pitches between adjacent patterns 20 on the second region 16 could be the same or different. Nevertheless, it would also be desirable to reverse the aforementioned design by adjusting the size of the mask used during the photo-etching process to form mandrels 18 with different widths or pitches between mandrels 18 on the first region 14 and patterns 20 with equivalent widths or pitches between patterns 20 on the second region 20, which are all within the scope of the present invention. Moreover, it should be noted that no matter the mandrels 18 on first region 14 share equivalent widths or patterns 20 on second region 16 share different widths, the widths of all the patterns 20 on the second region 16 are greater than the widths of the mandrels 18 on the first region 14, or the width of each pattern 20 on the second region 16 is preferably greater than the width of each mandrel 18 on the first region 14.

Figure 2:
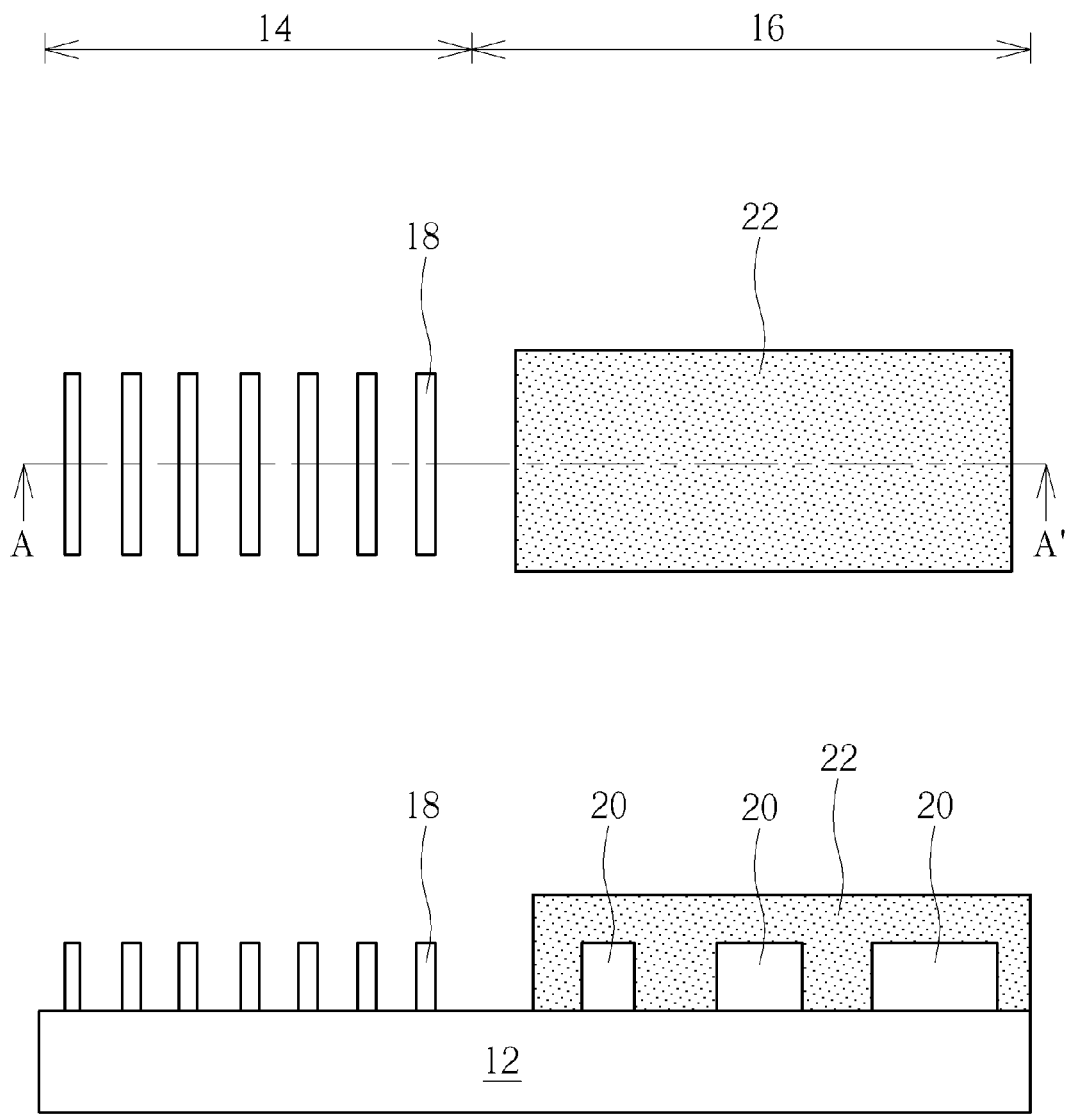

Next, as shown in FIG. 2, a patterned hard mask 22 is formed on the second region 16 to cover all of the patterns 20, including sidewalls and top surface of each pattern 20. In this embodiment, the hard mask 22 and the patterns 20 are preferably composed of different material. For instance, the hard mask 22 could be a patterned photoresist or could be a dielectric material selected from the group consisting of silicon nitride and silicon oxide.

Figure 3:
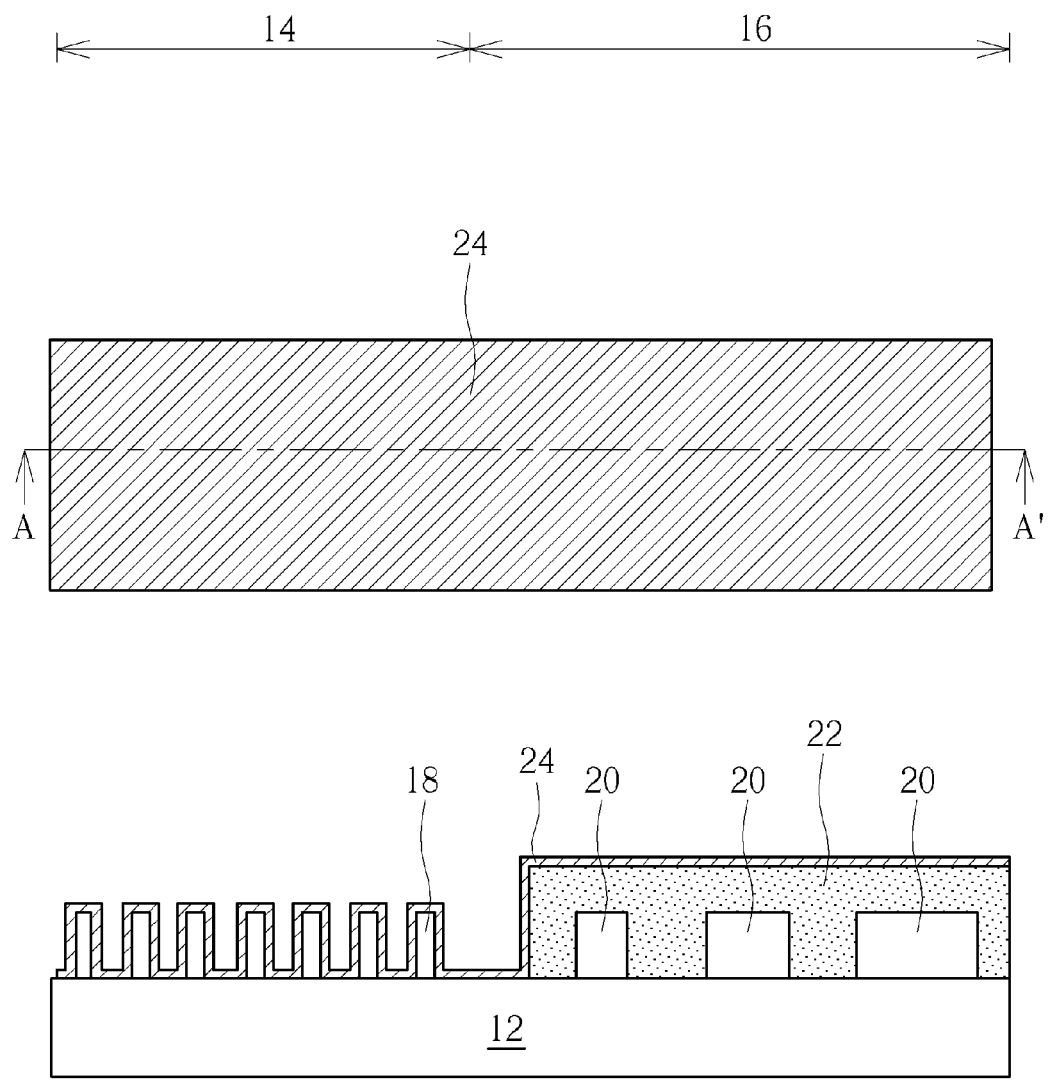

Next, as shown in FIG. 3, a cap layer 24 is formed on the first region 14 and second region 16 to cover the mandrels 18 and hard mask 22. Specifically, the cap layer 24 is conformally formed on the substrate 12 to cover sidewalls and top surfaces of the mandrels 18 and patterns 22. It should be noted that since the patterns 20 on second region 16 have already been covered by the hard mask 22, the cap layer 24 preferably does not contact the patterns 20 directly. In this embodiment, the cap layer 24 and the mandrels 18, patterns 20, and hard mask 22 are preferably composed of different material, in which the cap layer 24 could be selected from the group consisting of silicon nitride, silicon oxide, silicon oxynitride, and silicon carbon nitride, but noted limited thereto.

Figure 4:
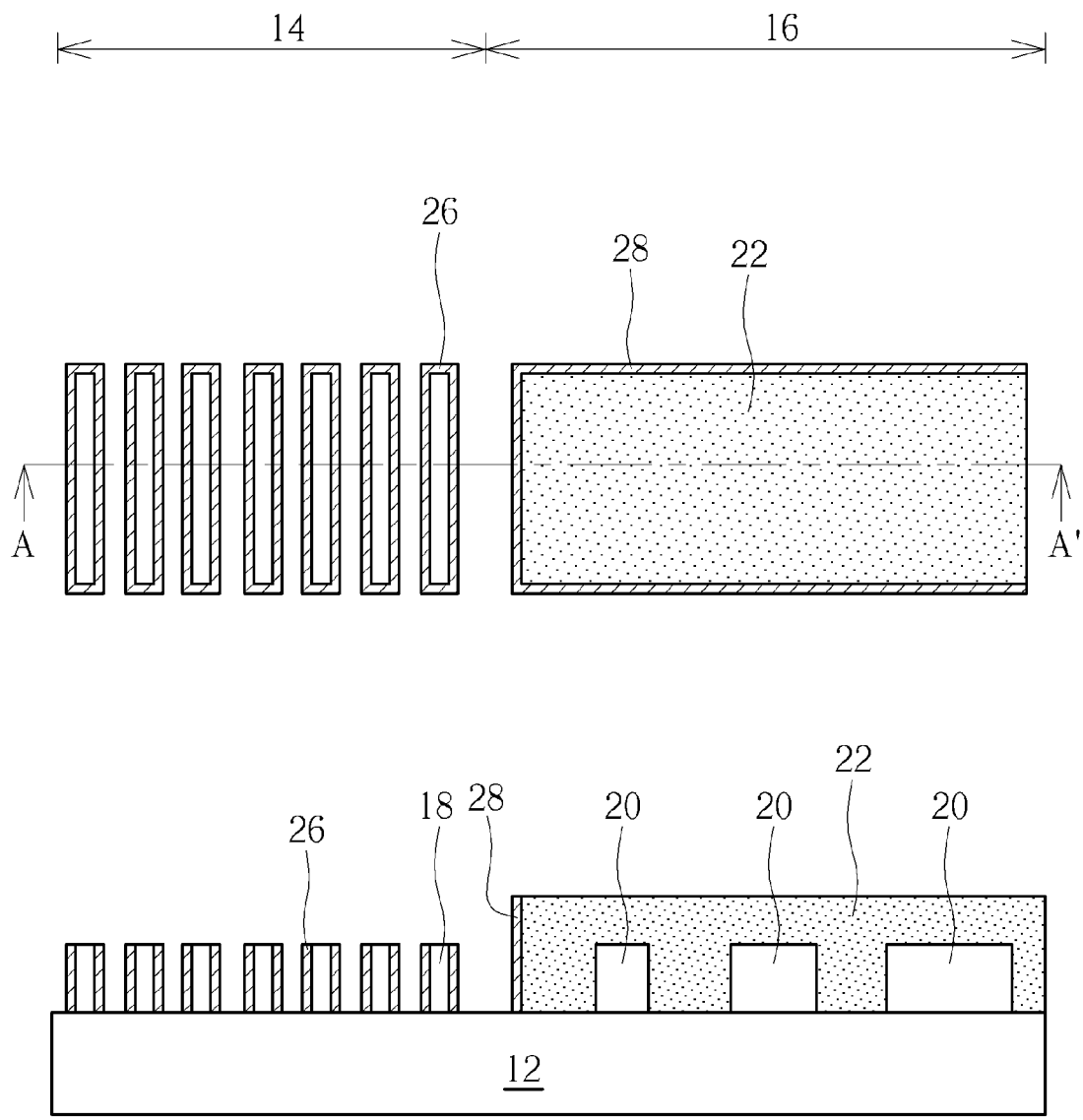

Next, as shown in FIG. 4, part of the cap layer 24 is removed to form a first spacer 26 adjacent to the sidewalls of each mandrel 18 while exposing the top surface of each mandrel 18 and a second spacer 28 adjacent to the sidewalls of the hard mask 22 while exposing the top surface of the hard mask 22. According to the top view illustrated in the top portion of FIG. 4, each first spacer 26 is substantially rectangular shaped to surround each mandrel 18, and the second spacer 28 is also rectangular shaped to surround the entire hard mask 22.

Figure 5:
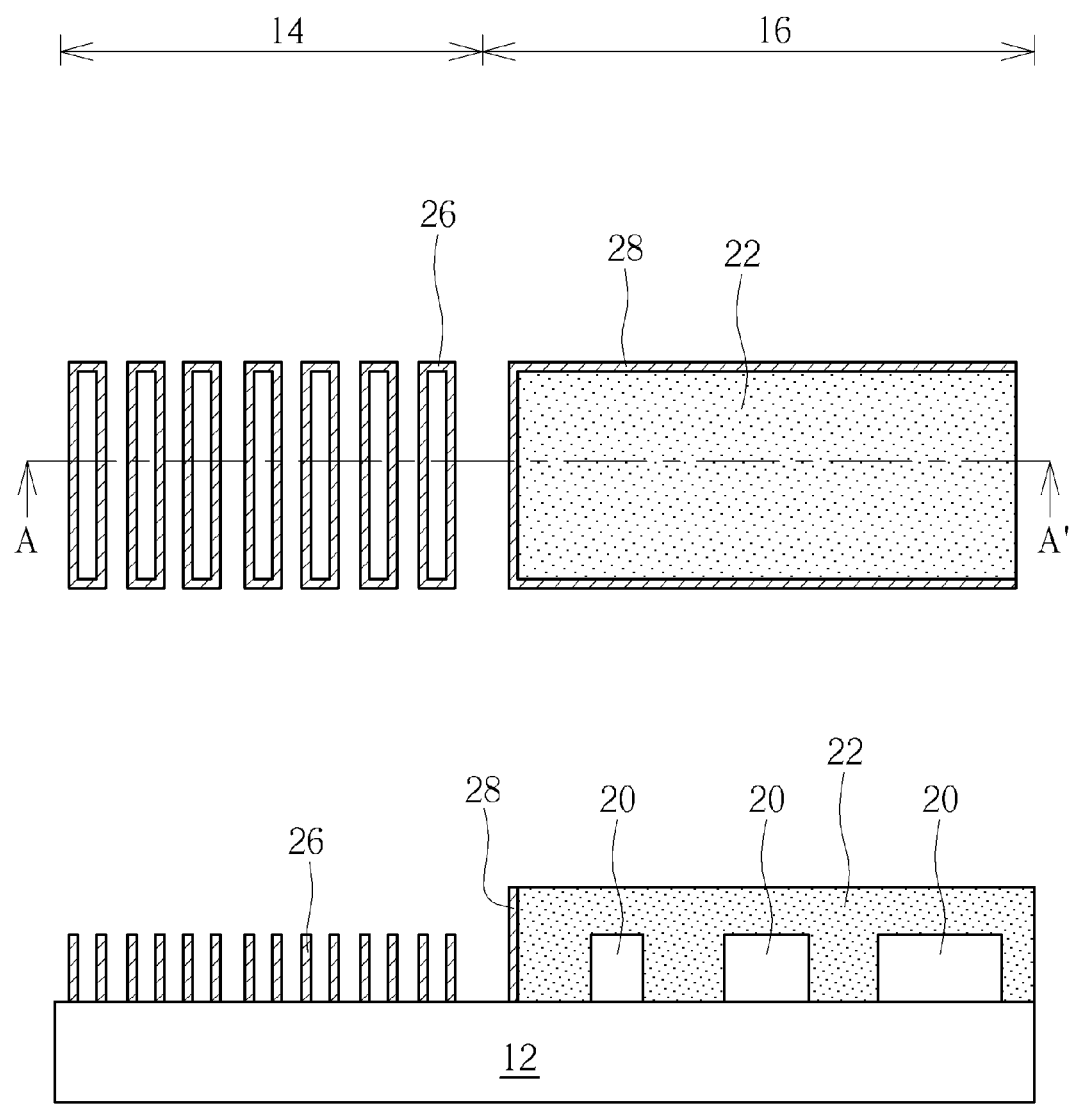

Next, as shown in FIG. 5, an etching process is conducted by using the hard mask 22 on second region 16 as mask to remove all of the mandrels 18 from first region 14 so that only the first spacers 26 are remained on the substrate 12.

Figure 6:
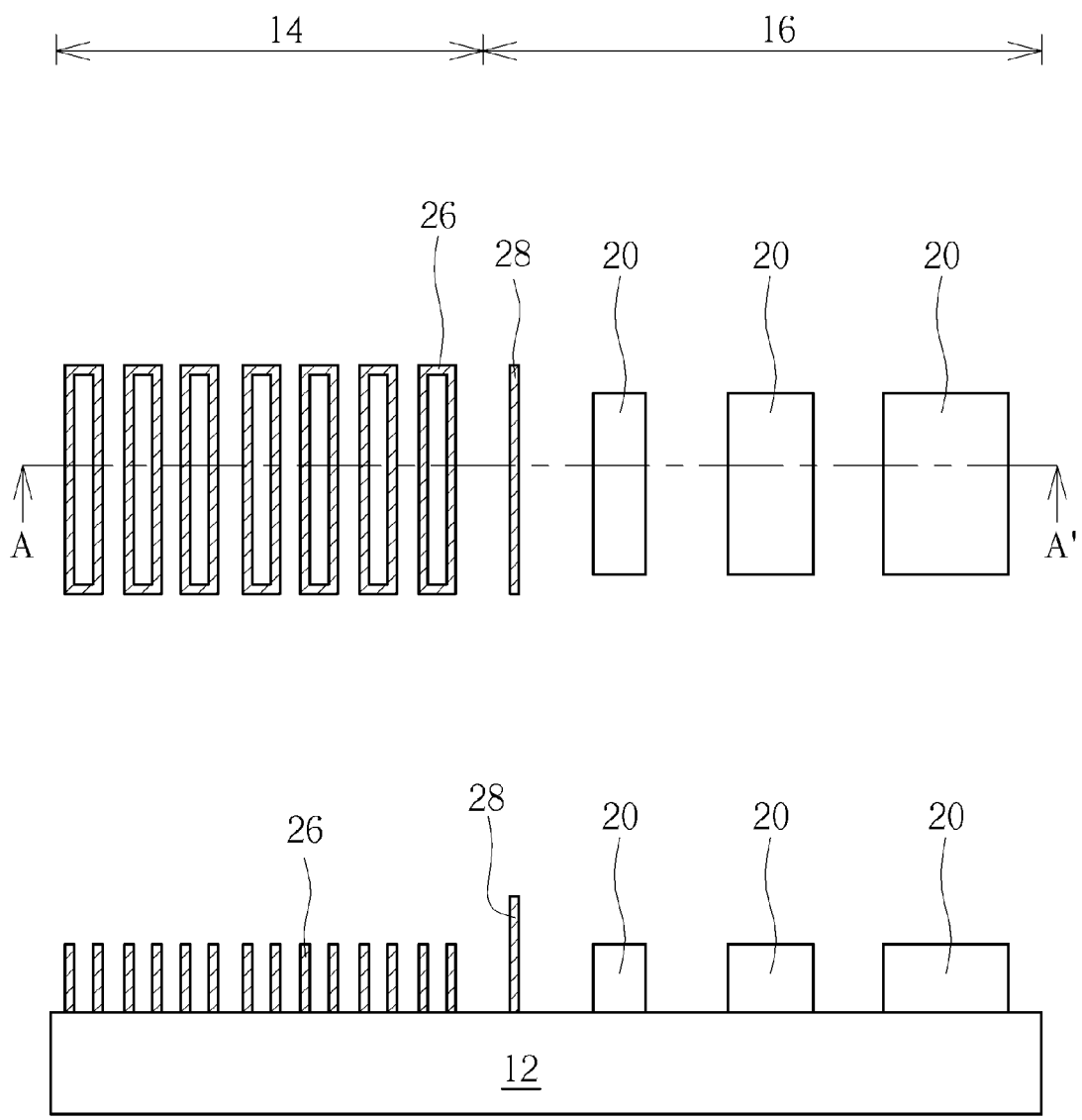

Next, as shown in FIG. 6, the hard mask 22 is removed from the second region 16 to expose the patterns 20. According to an embodiment of the present invention, the removal of the hard mask 22 could be accomplished by conducting an etching process to remove the hard mask 22 directly so that the rectangular second spacer 28 surrounding the hard mask 22 would remain on the substrate 12, or as shown in FIG. 6, covering the first spacers 26 on first region 14 and part of the second spacer 28 on second region 16 with a patterned mask (not shown), and then conducting an etching process to remove the hard mask 22 and part of the second spacer 28 surrounding the hard mask 22 on second region 16. After removing the patterned mask, a plurality of rectangular first spacers 26 are formed on the first region 14 and a single stripe-shaped second spacer 28 and plurality of patterns 20 are formed on the second region 16.

Figure 7:
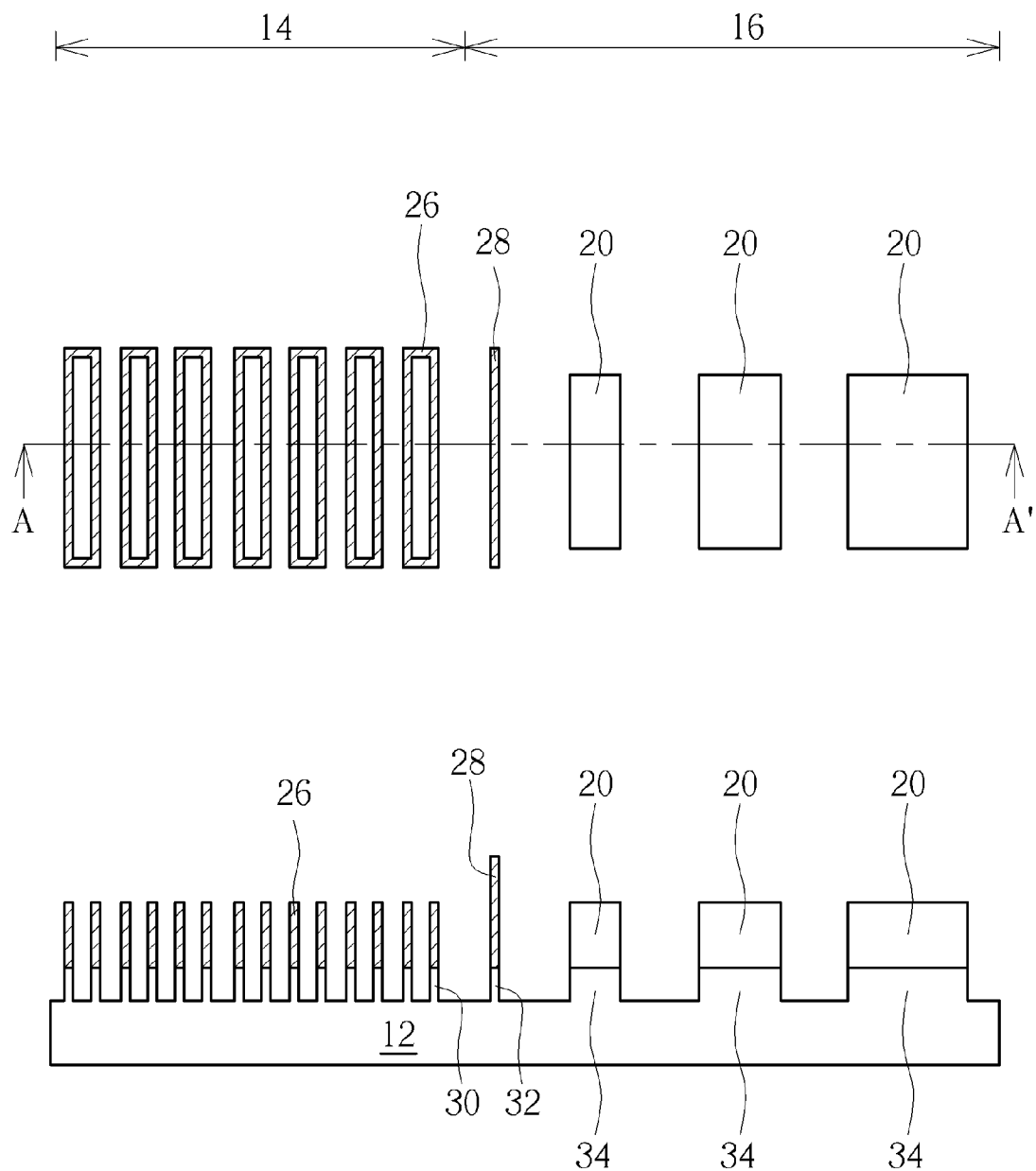

Next, as shown in FIG. 7, an etching process is conducted by using the first spacers 26 on first region 14 and second spacer 28 and patterns 20 on second region 16 as mask to remove part of the substrate 12 to form a plurality of first fin-shaped structures 30 on the first region 14, a single second fin-shaped structure 32 on the second region 16, and a plurality of bases 34 on the second region 16. According to an embodiment of the present invention, it would also be desirable to form at least a mask layer (not shown) on the substrate 12 surface entirely and then form the mandrels 18 and patterns 20 on this mask layer, so that during the aforementioned etching process, the pattern of the first spacers 26, second spacer 28, and patterns 20 is transferred to the mask layer before transferring to the substrate 12 to form the first fin-shaped structures 30, second fin-shaped structure 32, and bases 34.

Figure 8:
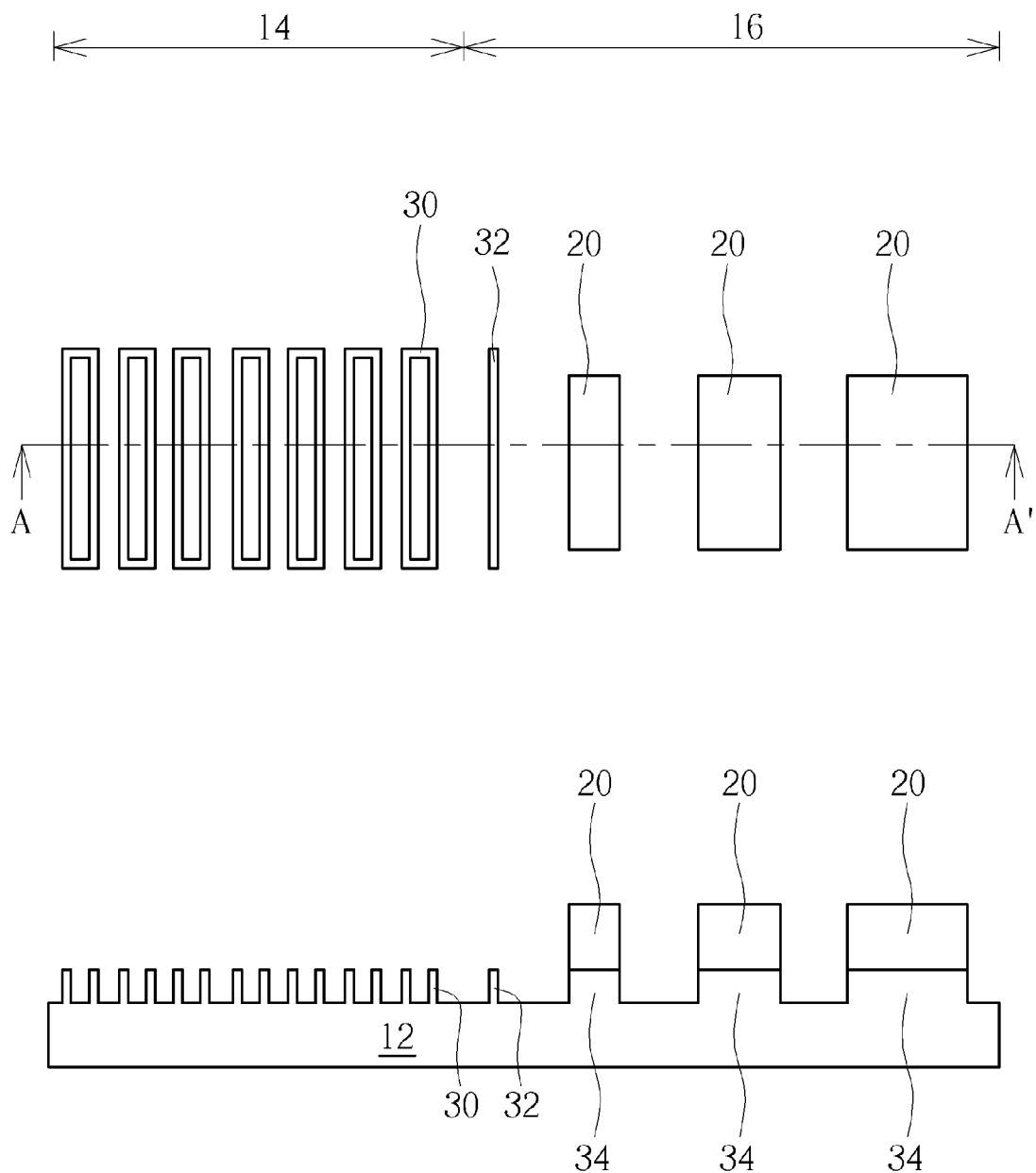

Next, as shown in FIG. 8, the first spacers 26 on the first region 14 and second spacer 28 on the second region 16 are removed to expose the first fin-shaped structures 30 and second fin-shaped structure 32. In this step, since the shapes of the first fin-shaped structures 30 and second fin-shaped structure 32 are transferred from the pattern of the first spacers 26 and second spacer 28 to the substrate 12, each of the first fin-shaped structures 30 at this stage is preferably rectangular shaped while the second fin-shaped structure 32 is stripe-shaped.

Figure 9:
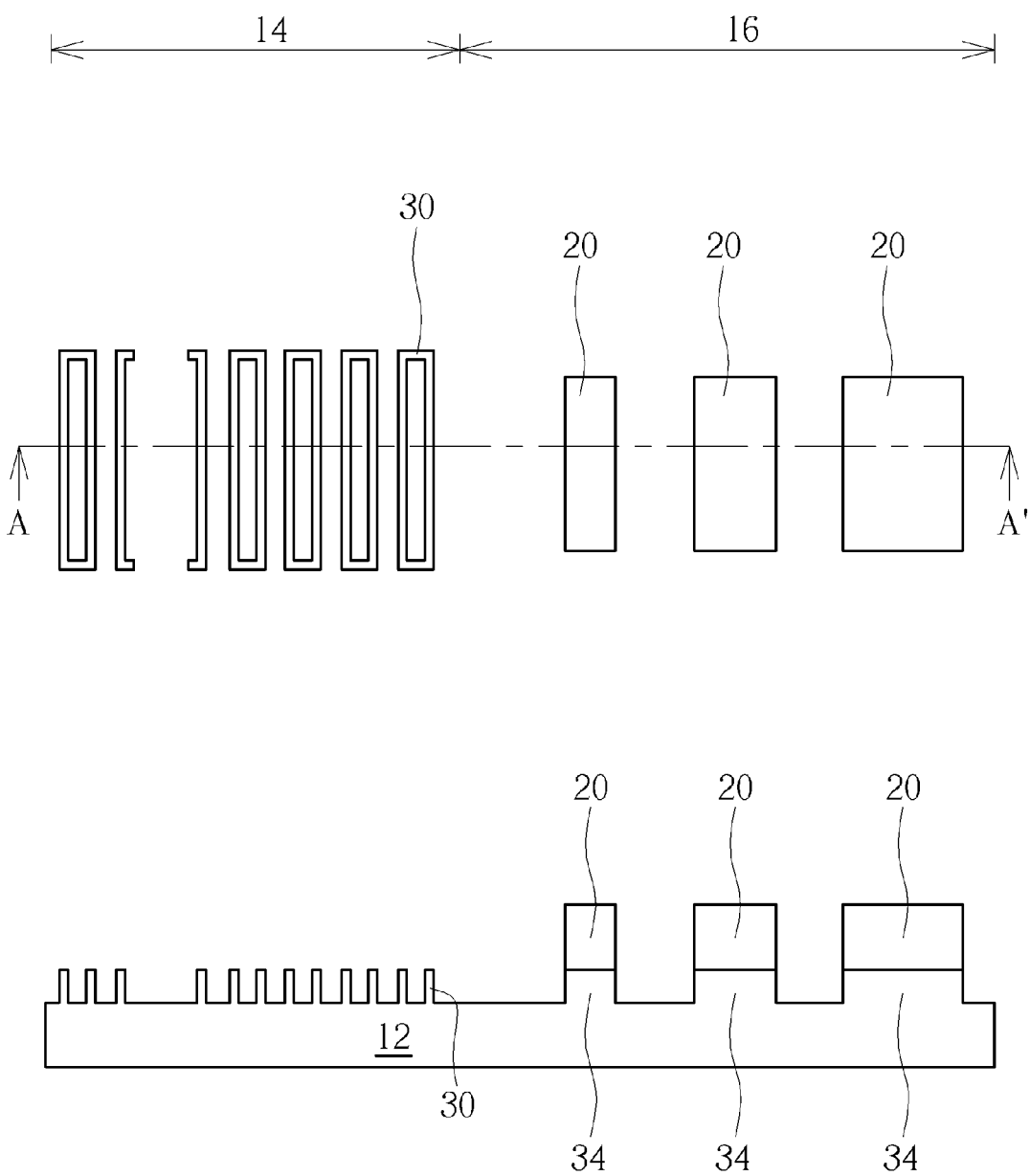

Next, as shown in FIG. 9, a fin-cut process is conducted to remove part of the first fin-shaped structures 30 and the entire second fin-shaped structure 32. As shown in the top view on the top portion of FIG. 9, the first fin-shaped structures 30 that have not been removed during the fin-cut process still remain rectangular-shaped, the first fin-shaped structures 30 that have been removed during the fin-cut process preferably become stripe-shaped, and the second fin-shaped structure 32 that has been removed during the fin-cut process is no longer visible in the top view diagram. As shown in the cross-sectional view on the bottom portion of FIG. 9, the first fin-shaped structures 30 either not being removed in the fin-cut process or partly removed in the fin-cut process are formed to protrude from the substrate 12 surface, and the second fin-shaped structure 32 that has been removed during the fin-cut process no longer exists in the figure. This completes the fabrication of a semiconductor device according to a preferred embodiment of the present invention.

Next, another fin-cut process could be conducted according to the demand of the process to remove part of the first fin-shaped structures 30 on the first region 14 so that all of the first fin-shaped structures 30 would become independently stripe-shaped. Next, all of the patterns 20 could be selectively removed to conduct a transistor fabrication process, which could include steps such as forming gate structures on the first fin-shaped structures 30 on first region 14 and bases 34 on second region 16, and then forming transistor elements such as source/drain regions, epitaxial layer, silicides, and contact etch stop layer (CESL). Additionally, it would also be desirable to carry out a replacement metal gate (RMG) process to transform the gate structure into metal gate. As the formation of aforementioned transistor elements and RMG process are well known to those skilled in the art, the details of which are not explained herein for the sake of brevity.

Figure 10:
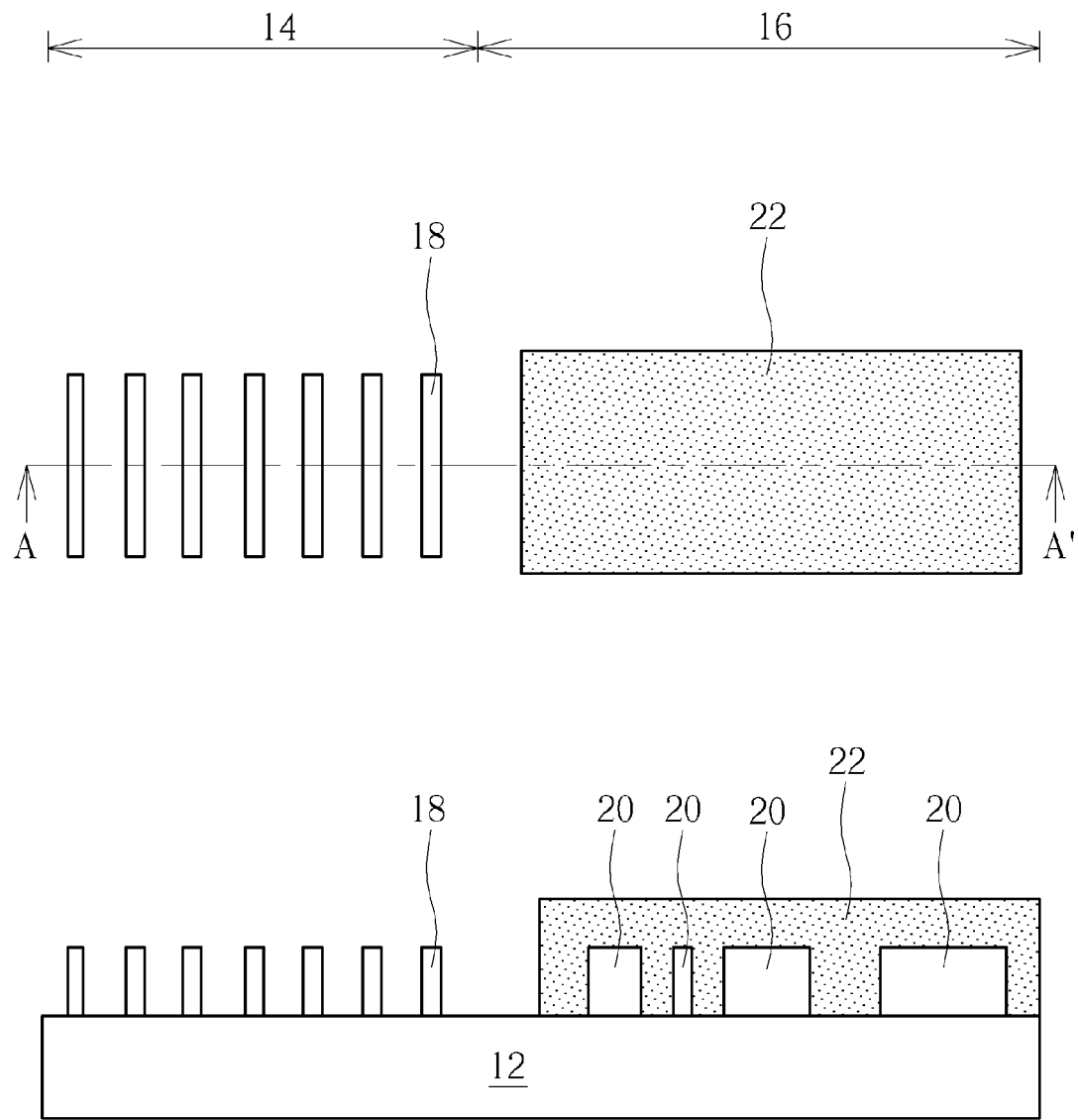
FIGS. 10-11 illustrate a method for fabricating semiconductor device according an embodiment of the present invention.
Figure 11:
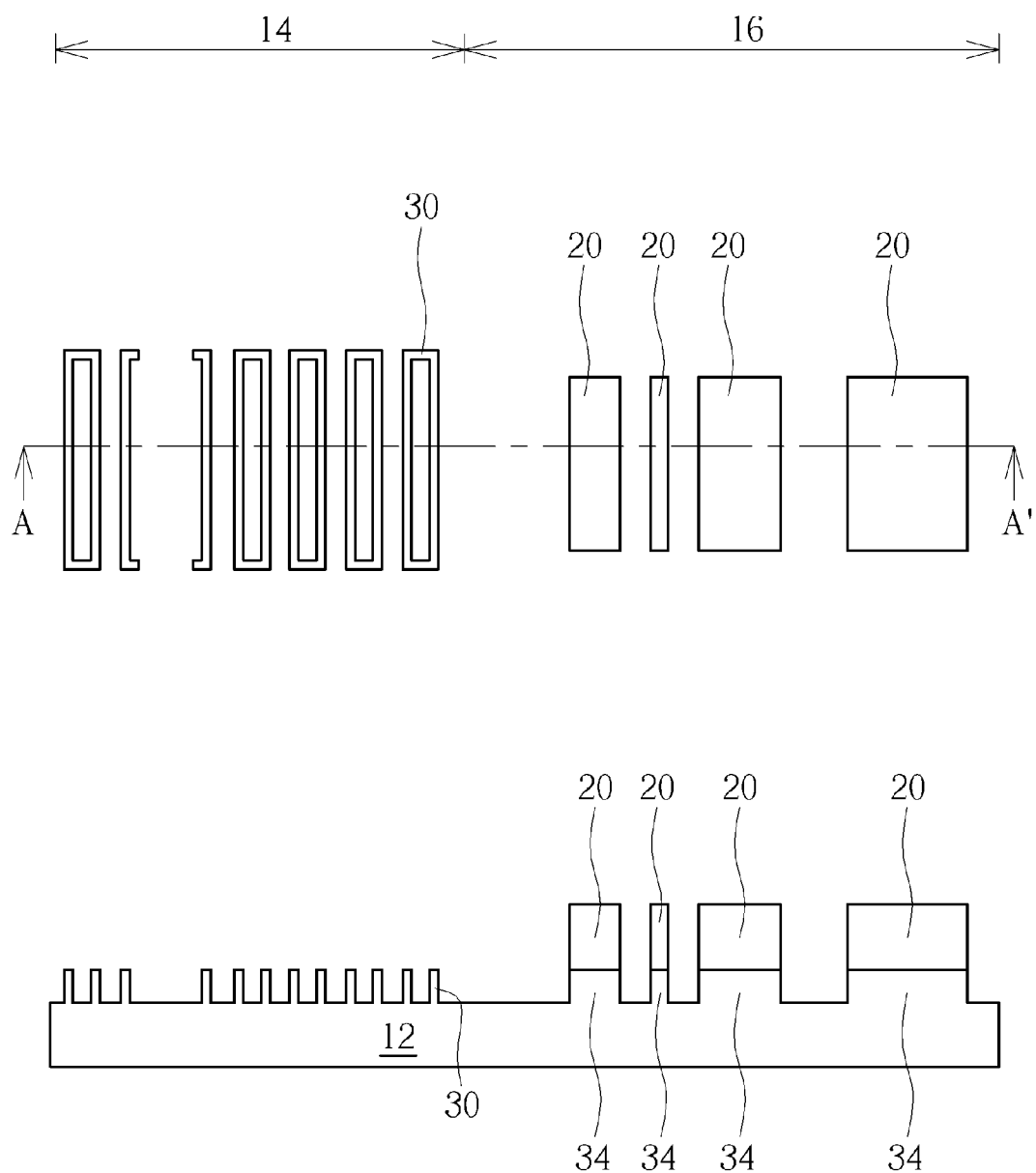

Referring to FIGS. 10-11, FIGS. 10-11 illustrate a method for fabricating semiconductor device according an embodiment of the present invention. As shown in FIG. 10, it would be desirable to first follow the process conducted in FIGS. 1-2 to form a plurality of mandrels 18 on a first region 14 and a plurality of patterns 20 on a second region 16 of a substrate 12, and then form a patterned hard mask 22 on the second region 16 to cover the patterns 20. In contrast to the aforementioned embodiment, not all of the patterns 20 formed on the second region 16 are larger than the mandrels 18 on the first region 14. For instance, while the patterns 20 preferably include different widths, the smallest width of at least one of the patterns 20 could be equivalent to the width of the mandrel 18.

Next, as shown in FIG. 11, processes conducted in FIGS. 3-9 could be carried out to form first spacers (not shown) adjacent to the mandrels 18 on the first region 14 and a second spacer (not shown) on the second region 16, and then using the first spacers on first region 14 and second spacer and patterns 20 on second region 16 to remove part of the substrate 12 for forming first fin-shaped structures 30 on first region 14 and bases 34 on the second region 16.

Figure 12:
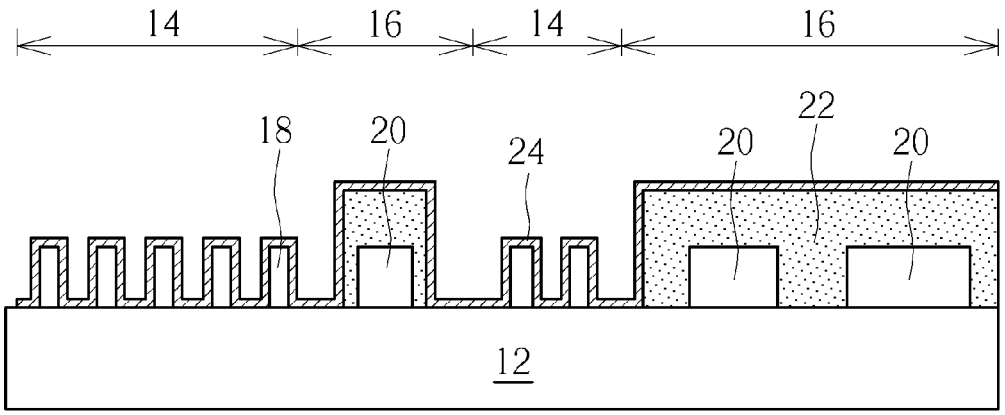
FIG. 12-14 illustrate a method for fabricating semiconductor device according to an embodiment of the present invention.
Figure 13:
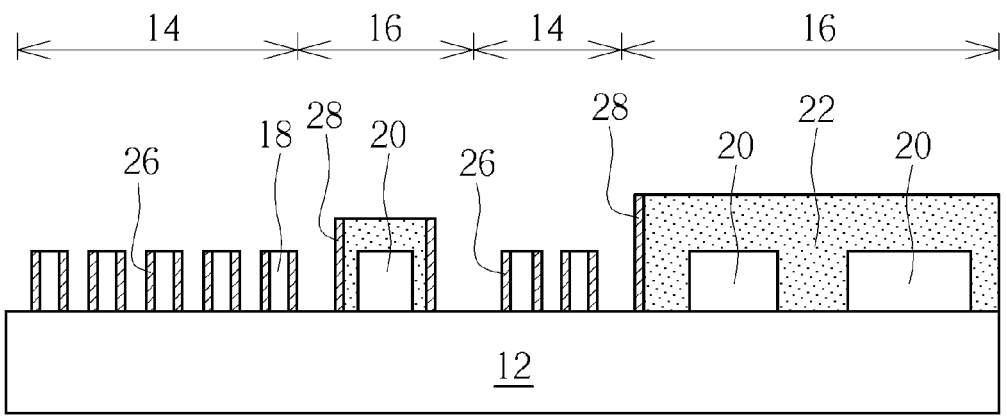
Figure 14:
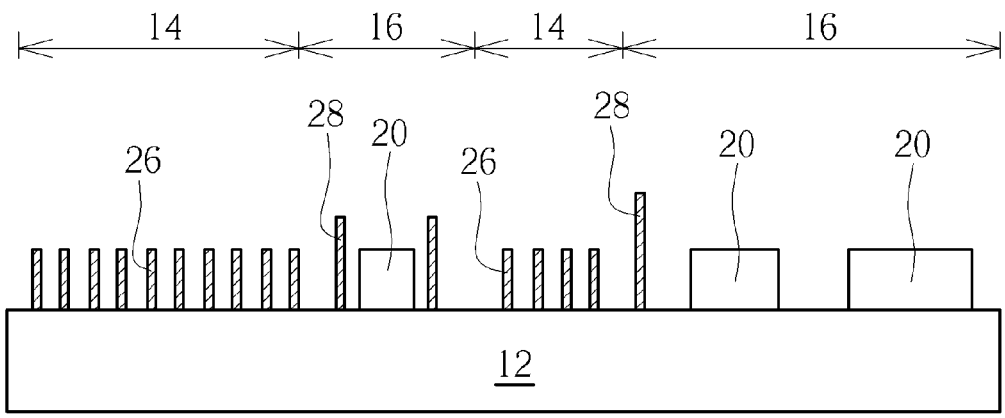

Referring to FIGS. 12-14, FIG. 12-14 illustrate a method for fabricating semiconductor device according to another embodiment of the present invention. Similar to the aforementioned embodiment, this embodiment also defines a plurality of first regions 14 and a plurality of second regions 16 on a substrate 12, and then forms a plurality of mandrels 18 on the each first region 14 and a plurality of patterns 20 on each second region 16. The formation of the mandrels 18 and patterns 20 could be accomplished by means disclose above, and the details of which are not explained herein for the sake of brevity.

In contrast to the aforementioned embodiment, the patterns 20 on second regions 16 of this embodiment are not completely separated from the mandrels 18 on first regions 14. For instance, as shown in FIG. 12, the patterns 20 on second regions 16 could be disposed between the mandrels 18 on the first regions 14, so that the mandrels 18 and patterns 20 are disposed according to an alternating manner. Next, a hard mask 22 is formed on each second region 16 to cover all of the patterns 20, and a cap layer 24 is formed to cover the mandrels 18 on first regions 14 and the hard mask 22 on second regions 16.

Next, as shown in FIG. 13, part of the cap layer 24 is removed to form a first spacer 26 adjacent to the sidewalls of each mandrel 18 while exposing the top surface of each mandrel 18 and a second spacer 28 adjacent to the sidewalls of each hard mask 22 while exposing the top surface of each hard mask 22.

Next, as shown in FIG. 14, an etching process is conducted by using the hard masks 22 on second region 16 as mask to remove all of the mandrels 18 from the first regions 14, and the hard masks 22 are removed from the second regions 16 to expose the patterns 20.

Next, fabrications disclosed in FIGS. 7-9 could be conducted to first using the first spacers 26, second spacers 28, and patterns 20 to remove part of the substrate 12, and removing the first spacers 26 and second spacers 28 to form a plurality of first fin-shaped structures (not shown) on the first regions 14, a plurality of second fin-shaped structures (not shown) on the second regions 16, and a plurality of bases (not shown) under the patterns 20. A fin-cut process is then carried out to remove part of the first fin-shaped structures and the entire second fin-shaped structures. This completes the fabrication of a semiconductor device according to an embodiment of the present invention.

Figure 15:
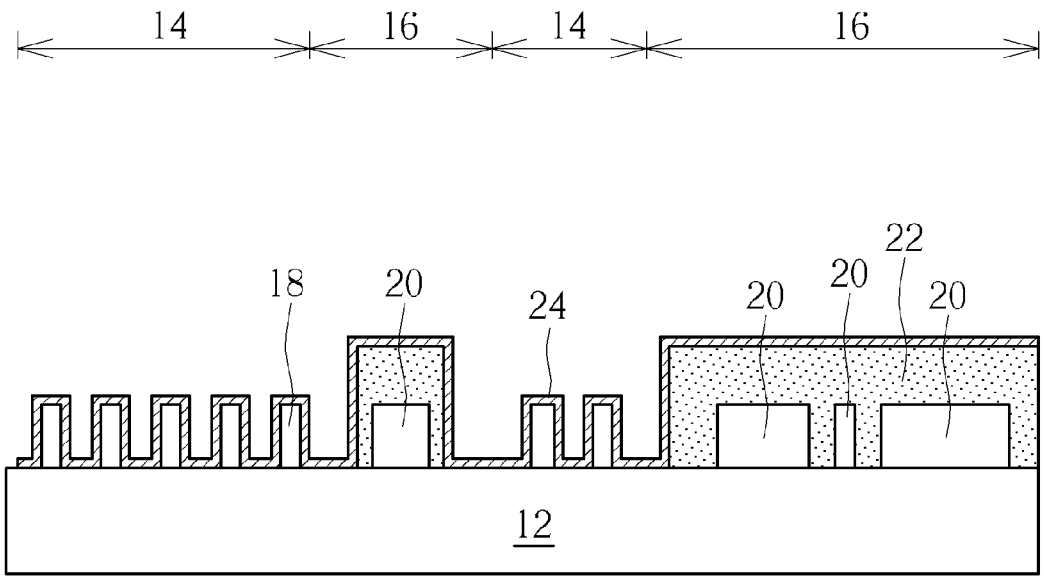
FIGS. 15-16 illustrate a method for fabricating semiconductor device according an embodiment of the present invention.
Figure 16:
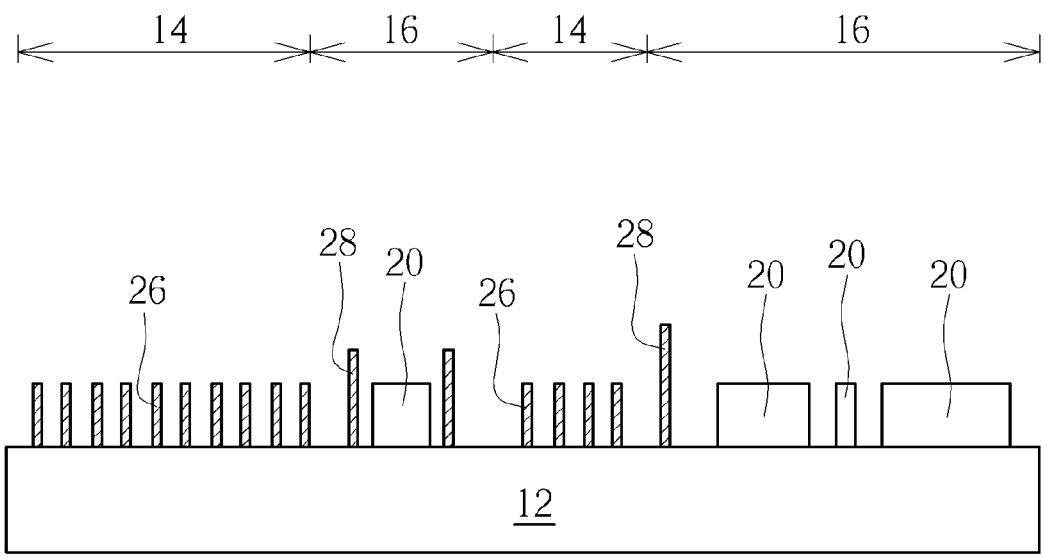

Referring to FIGS. 15-16, FIGS. 15-16 illustrate a method for fabricating semiconductor device according an embodiment of the present invention. As shown in FIG. 15, it would be desirable to first follow the process conducted in FIG. 12 to form a plurality of mandrels 18 on first regions 14 and a plurality of patterns 20 on second regions 16 of a substrate 12, and then form a patterned hard mask 22 on the second regions 16 to cover the patterns 20. Similar to the embodiment in FIG. 10, not all of the patterns 20 formed on the second regions 16 are larger than the mandrels 18 on the first region 14. For instance, while the patterns 20 preferably include different widths, the smallest width of at least one of the patterns 20 could be equivalent to the width of the mandrel 18 on first region 14.

Next, as shown in FIG. 16, processes conducted in FIGS. 13-14 could be carried out to form first spacers 26 adjacent to the mandrels 18 on the first regions 14 and second spacers 28 on the second regions 16, use the hard masks 22 to remove all of the mandrels 18 from the first regions 14, and then remove the hard masks 22.

Next, fabrications disclosed in FIGS. 7-9 could be conducted to first using the first spacers 26, second spacers 28, and patterns 20 to remove part of the substrate 12, and removing the first spacers 26 and second spacers 28 to form a plurality of first fin-shaped structures (not shown) on the first regions 14, a plurality of second fin-shaped structures (not shown) on the second regions 16, and a plurality of bases (not shown) under the patterns 20. A fin-cut process is then carried out to remove part of the first fin-shaped structures and the entire second fin-shaped structures.

According to other embodiments of the present invention, it would also be desirable to employ the aforementioned processes to other semiconductor processes. For instance, a target layer (not shown) could be formed on the substrate 12 entirely, and a plurality of mandrels 18 and a plurality of patterns 20 are formed on the target layer. Next, similar to the aforementioned two embodiments, the patterns of the first pacers 26, second spacers 28, and patterns 20 are transfer to the target layer so that patterns with different widths and/or gaps are formed on first region 14 and second region 16 respectively. Preferably, if the target layer includes a gate material layer, it would be desirable to employ the aforementioned process to form gate patterns with different widths and/or pitches on first region 14 and second region 16 respectively. If the target layer includes metal material, it would be desirable to employ the aforementioned process to form conductive wires with different widths and/or pitches on the first region 14 and second region 16.

Overall, the present invention discloses an approach of using STI technique to form fin-shaped structures and bases of different sizes on a substrate, in which the fin-shaped structures having smaller pitches are preferably used to form FinFET devices while bases with larger pitches are used to form planar MOS transistors or other active or passive devices. According to a preferred embodiment of the present invention, the formation of the fin-shaped structures and bases could be accomplished by first forming a plurality mandrels on the first region of a substrate and a plurality of patterns on the second region, forming a hard mask to cover the patterns on second region, and then forming a cap layer on the mandrels and the patterns. Next, etching back is conducted to form spacers adjacent to the mandrels and patterns, removing the mandrels and hard mask, and then using spacers to remove part of the substrate to form fin-shaped structures on first region and second fin-shaped structures and aforementioned bases on second region. The second fin-shaped structure is then removed thereafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for fabricating a semiconductor device, comprising:
   providing a substrate having a first region and a second region;
   forming a plurality of mandrels on the first region and a plurality of patterns on the second region, wherein the plurality of mandrels comprise a plurality of first widths and the plurality of patterns comprise a plurality of second widths and the plurality of second widths are greater than the plurality of first widths;
   forming a hard mask on the second region to cover the plurality of patterns;
   forming a cap layer on the first region and the second region to cover the plurality of mandrels and the hard mask;
   removing part of the cap layer to form first spacers on sidewalls of the plurality of mandrels and a second spacer on sidewalls of the hard mask;
   removing the plurality of mandrels from the first region;
   removing the hard mask from the second region;
   using the first spacers, the second spacer, and the plurality of patterns as a mask to remove part of the substrate;
   removing the first spacers and the second spacer thereby forming a plurality of first fin-shaped structures and a second fin-shaped structure; and
   performing a fin-cut process to remove the second fin-shaped structure.

2. The method of claim 1, wherein the plurality of mandrels comprise a first height and the plurality of patterns comprise a second height and the first height and the second height are the same.

3. The method of claim 1, wherein the plurality of mandrels comprise a first material and the plurality of patterns comprise a second material and the first material and the second material are the same.

4. The method of claim 1, wherein the plurality of first widths of the plurality of mandrels are the same.

5. The method of claim 1, wherein the plurality of second widths of the plurality of patterns are different.

6. The method of claim 1, further comprising forming the cap layer on the substrate and on both sidewalls and top surfaces of the plurality of mandrels and the hard mask.

7. The method of claim 1, wherein a width of each of the first spacers is smaller than each of the plurality of first widths of the plurality of mandrels.

8. A method for fabricating a semiconductor device, comprising:
   providing a substrate having a first region and a second region;
   forming a plurality of mandrels on the first region and a plurality of patterns on the second region;
   forming a hard mask on the second region to cover the plurality of patterns;
   forming a cap layer on the first region and the second region to cover the plurality of mandrels and the hard mask;
   removing part of the cap layer thereby forming first spacers on sidewalls of the plurality of mandrels and a second spacer on sidewalls of the hard mask;
   removing the plurality of mandrels from the first region;
   removing the hard mask from the second region; and
   using the first spacers, the second spacer, and the plurality of patterns as a mask to remove part of the substrate.

9. The method of claim 8, wherein the plurality of mandrels comprise a first height and the plurality of patterns comprise a second height and the first height and the second height are the same.

10. The method of claim 8, wherein the plurality of mandrels comprise a first material and the plurality of patterns comprise a second material and the first material and the second material are the same.

11. The method of claim 8, wherein the plurality of mandrels comprise a plurality of first widths and the plurality of first widths are the same.

\* \* \* \* \*